US011967512B2

(12) United States Patent
Sambu et al.

(10) Patent No.: US 11,967,512 B2
(45) Date of Patent: Apr. 23, 2024

(54) SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Makoto Sambu, Toyama (JP); Nobuaki Takehashi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 249 days.

(21) Appl. No.: 17/000,804

(22) Filed: Aug. 24, 2020

(65) Prior Publication Data
US 2021/0074561 A1 Mar. 11, 2021

(30) Foreign Application Priority Data

Sep. 6, 2019 (JP) .................................. 2019-162703

(51) Int. Cl.
H01L 21/67 (2006.01)
(52) U.S. Cl.
CPC .. H01L 21/67115 (2013.01); H01L 21/67103 (2013.01); H01L 21/67248 (2013.01); H01L 21/67253 (2013.01); H01L 21/67276 (2013.01)
(58) Field of Classification Search
CPC .................. H01L 21/67248; H01L 21/67115
See application file for complete search history.

(56) References Cited

U.S. PATENT DOCUMENTS 5,029,554 A 7/1991 Miyashita et al.
6,746,908 B2 * 6/2004 Tanaka .................... C30B 31/18
438/362
(Continued)

FOREIGN PATENT DOCUMENTS

JP 01-251725 A 10/1989
JP 04-134816 A2 5/1992
(Continued)

OTHER PUBLICATIONS

English translation JP 2008130673, Jun. 2008, Kaneko (Year: 2008).*
(Continued)

Primary Examiner — Keath T Chen
(74) Attorney, Agent, or Firm — Volpe Koenig

(57) ABSTRACT

Described herein is a technique capable of reducing a thermal damage to a furnace opening structure when processing a substrate at a high temperature. According to one aspect thereof, there is provided a substrate processing apparatus including: a reaction tube provided with a furnace opening; heaters provided respectively in a plurality of zones arranged along a tube axis direction; temperature sensors respectively corresponding to the zones; a temperature controller configured to control electric power based on temperature data obtained by the temperature sensors, wherein the temperature controller is configured to, when the substrates are subject to a heat treatment process by the heaters, control the electric power supplied to the heaters such that temperatures of upper heaters about as high as the substrates reach predetermined temperatures, and that a temperature gradient is formed in lower zones lower than the substrates such that a temperature decreases toward the furnace opening.

17 Claims, 6 Drawing Sheets

(56) References Cited

U.S. PATENT DOCUMENTS

| | | | |
|---|---|---|---|
| 7,930,059 B2 | 4/2011 | Sugishita et al. | |
| 2003/0221623 A1 | 12/2003 | Nobuhito et al. | |
| 2006/0105107 A1* | 5/2006 | Lindeboom | C23C 16/4404 |
| | | | 427/248.1 |
| 2013/0042803 A1 | 2/2013 | Saido et al. | |

FOREIGN PATENT DOCUMENTS

| | | | | |
|---|---|---|---|---|
| JP | 05-144746 A2 | 6/1993 | | |
| JP | 2004-014543 A | 1/2004 | | |
| JP | 2006-100303 A | 4/2006 | | |
| JP | 38-34216 B2 | 10/2006 | | |
| JP | 2008130673 | * | 6/2008 | H01L 21/205 |
| JP | 2008-172061 A | 7/2008 | | |
| JP | 2009-076533 A | 4/2009 | | |
| JP | 4954678 B2 | * | 6/2012 | H01L 21/205 |
| JP | 51-13109 B2 | 1/2013 | | |
| WO | 2012/011423 A1 | 1/2012 | | |

OTHER PUBLICATIONS

Japanese Office Action dated Aug. 3, 2021 for Japanese Patent Application No. 2019-162703.
Korean Office Action dated Dec. 21, 2021 for Korean Patent Application No. 10-2020-0103214.

* cited by examiner

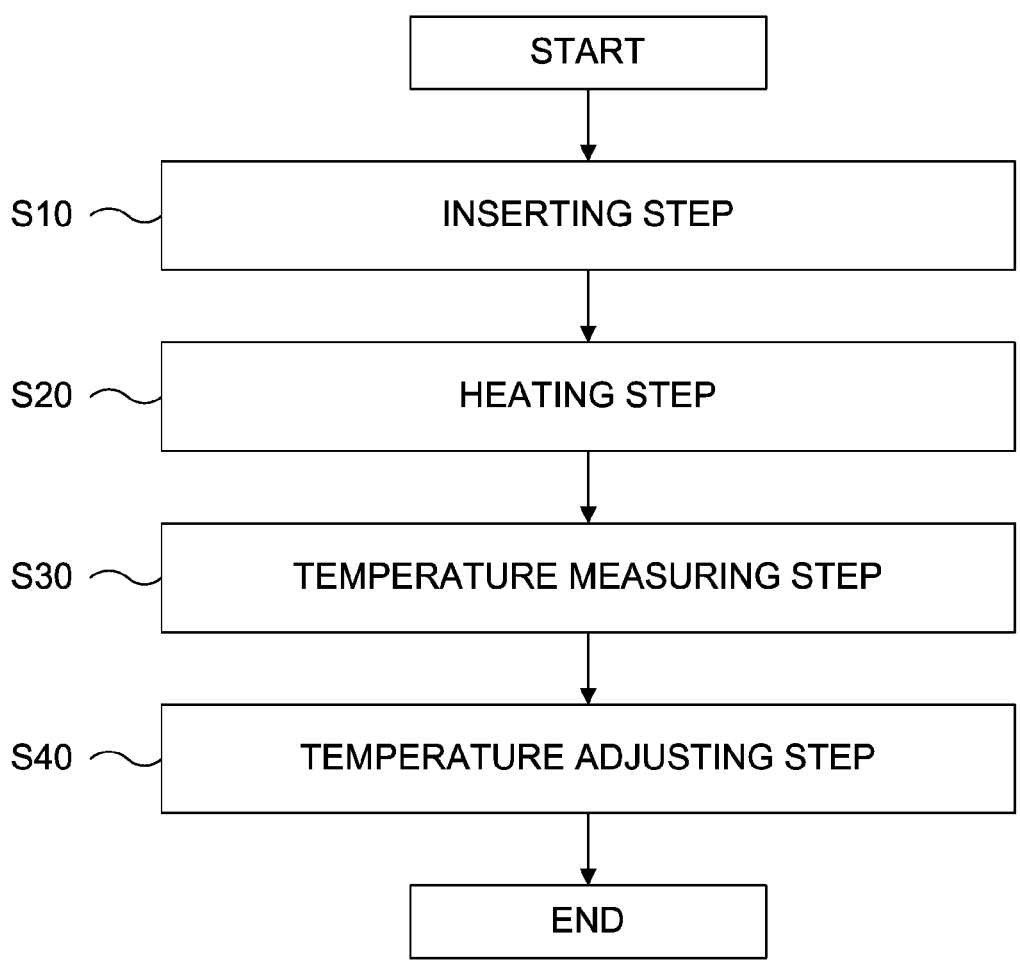

SUBSTRATE PROCESSING APPARATUS AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2019-162703, filed on Sep. 6, 2019, in the Japanese Patent Office, the entire contents of which are hereby incorporated by reference.

BACKGROUND

1. Field

The present disclosure relates to a substrate processing apparatus and a method of manufacturing a semiconductor device.

2. Description of the Related Art

In order to perform a heat treatment process to a substrate, a substrate processing apparatus may be used. For example, according to the substrate processing apparatus, a heater configured to heat the substrate is arranged around a reaction tube in which a plurality of substrates including the substrate are processed. By heating the substrate in the reaction tube to a predetermined temperature by the heater, the substrate is processed by the substrate processing apparatus. According to the substrate processing apparatus, for example, in order to uniformly process the substrate on a surface of the substrate, the substrate may be rotated by rotating a boat on which the substrate is placed (mounted) by a rotator.

In recent years, the substrate should be processed not only with uniformity on the surface of the substrate but also at a higher temperature. Therefore, there are demands for a substrate processing apparatus capable of processing the substrate in a higher temperature range in addition to a conventional temperature range.

A furnace opening structure (also referred to as a "furnace opening assembly") including a lid of the reaction tube and the rotator of the boat should be protected from the heat in the reaction tube. However, since a configuration of the furnace opening structure is designed to be compatible with the conventional temperature range, the furnace opening structure may be damaged by the heat when attempting to process the substrate in the higher temperature range described above.

SUMMARY

Described herein is a technique capable of reducing a thermal damage to a furnace opening structure when processing a substrate at a high temperature.

According to one aspect of the technique of the present disclosure, there is provided a processing apparatus including: a reaction tube provided with a furnace opening at one end thereof through which a boat accommodating a plurality of a substrates are to be inserted, wherein a process chamber in which the plurality of the substrates are processed is provided in the reaction tube; a plurality of heaters provided on an outer periphery of the reaction tube and respectively in a plurality of zones arranged along a tube axis direction from the furnace opening to an other end of the reaction tube; a plurality of temperature sensors configured to measure temperatures of the zones or temperatures of the heaters respectively corresponding to the plurality of the zones; a temperature controller configured to control electric power supplied to each of the heaters based on temperature data obtained by the plurality of the temperature sensors to adjust each of the temperatures of the zones; and a furnace opening assembly including a lid configured to close the furnace opening, wherein the plurality of zones includes upper zones and lower zones located closer to the furnace opening than the upper zones are located, the upper zones being located within a height range equivalent to that of the substrates accommodated in the boat whereas the lower zones are located within a height range excluding that of the substrates accommodated in the boat, and the plurality of the heaters including upper heaters of the upper zones and lower heaters of the lower zones, and wherein the temperature controller is configured to, when the plurality of the substrates are subject to a heat treatment process by the plurality of the heaters, control the electric power supplied to the plurality of the heaters such that temperatures of the upper heaters reach predetermined temperatures, and that a temperature gradient is formed in the lower zones such that a temperature decreases toward the furnace opening.

BRIEF DESCRIPTION OF THE DRAWINGS

FIG. 6 is a flow chart schematically illustrating an example of a heat treatment process according to the embodiments described herein.

DETAILED DESCRIPTION

Hereinafter, one or more embodiments (also simply referred to as "embodiments") according to the technique of the present disclosure will be described.

Embodiment

Figure 1:
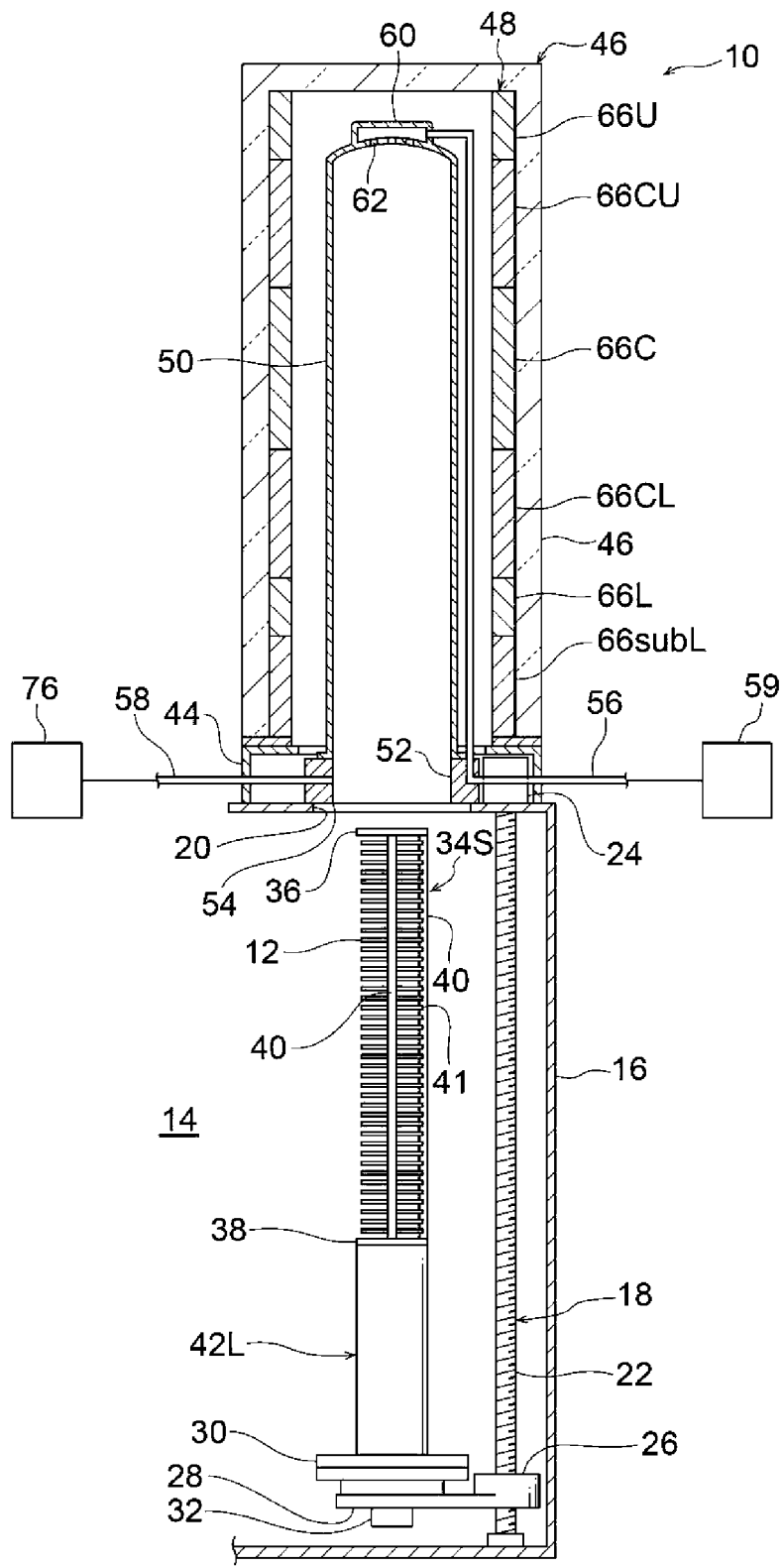
FIG. 1 schematically illustrates a vertical cross-section of a substrate processing apparatus according to one or more embodiments described herein.

As shown in FIG. 1, a substrate processing apparatus 10 according to an embodiment of the according to the technique of the present disclosure is configured to process a plurality of substrates including a substrate (for example, a semiconductor wafer) 12 by heating the plurality of the substrates. Parameters such as dimension of the substrate processing apparatus 10 are designed so as to be compatible with both a process of processing the substrate 12 at about 1,000° C. and a process of processing the substrate 12 at about 1,250° C.

The substrate processing apparatus 10 includes a housing 16 of a box shape defining a loading chamber 14 of a substantially rectangular parallelepiped shape. The loading chamber 14 of the housing 16 constitutes a standby chamber in which a boat 34S or a boat 34L (refer to FIG. 5), which will be described later, stands by for loading into and unloading out of a reaction tube 50 described later. A boat elevator 18 configured to elevate and lower the boat 34S or the boat 34L is installed in the loading chamber 14. In addition, a boat loading/unloading port 20 through which the boat 34S or the boat 34L passes is provided on a ceiling plate of the housing 16.

For example, the boat elevator 18 includes: a feed screw shaft 22 vertically provided in the loading chamber 14 and rotatably supported; a motor 24 provided outside the loading chamber 14 and configured to rotate the feed screw shaft 22; an elevator table 26 engaged with the feed screw shaft 22 and configured to be elevated or lowered as the feed screw shaft 22 rotates; and a support arm 28 horizontally projected on the elevator table 26.

Figure 2:
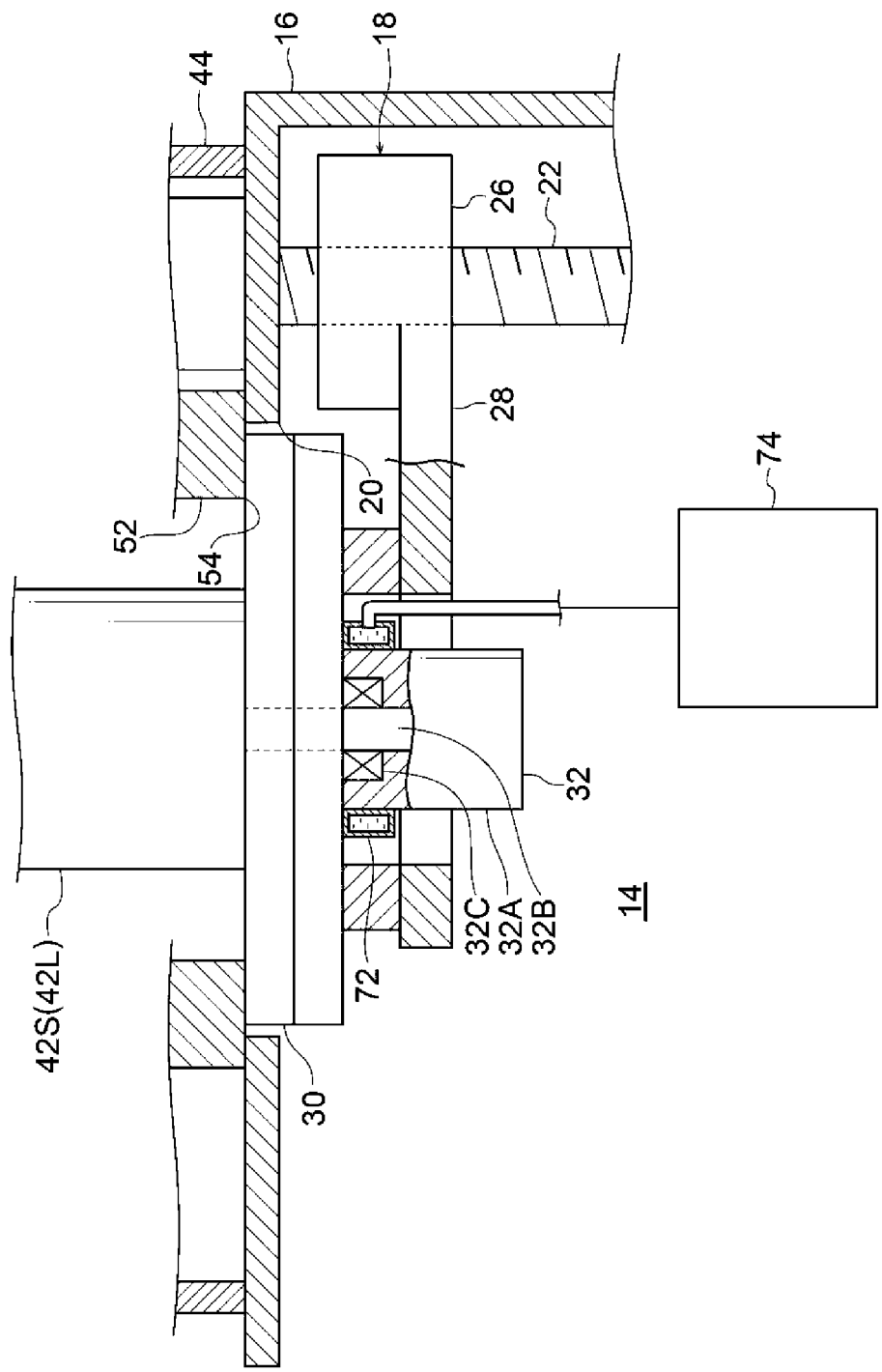
FIG. 2 schematically illustrates a vertical cross-section of a rotator of the substrate processing apparatus according to the embodiments described herein.

As shown in FIG. 2, a lid 30 configured to close a process space inside the reaction tube 50 described later is horizontally supported at a tip (front end) of the support arm 28. The lid 30 is of a disc shape.

A rotator (which is a rotating mechanism) 32 is provided below the lid 30. The rotator 32 is configured to rotate a heat insulating structure 42L or 42S and the boat 34S or 34L, which will be described later. The rotator 32 includes a motor and a speed reducer (both not shown) inside a housing 32A, and an output shaft 32B of the speed reducer is connected to the heat insulating structure 42L. The output shaft 32B may be connected to the heat insulating structure 42L via an extension shaft (not shown). The extension shaft made of a heat resistant material is configured to reduce the heat transfer by providing a cavity inside the extension shaft. A fluid seal 32C configured to prevent the leakage of a gas supplied into the reaction tube 50 is provided between the housing 32A and the output shaft 32B. A seal (not shown) such as a gasket is provided between the housing 32A and the lid 30 so as to seal a space between the housing 32A and the lid 30.

A water cooling jacket 72 of an annular shape is provided on an outer peripheral portion of the rotator 32. The water cooling jacket 72 is configured such that the cooling water sent from a cold water supply apparatus 74 is circulated inside the water cooling jacket 72 so as to cool the rotator 32 by the cooling water.

As shown in FIG. 1, the boat 34S includes: a pair of end plates (that is, an upper end plate 36 and a lower end plate 38); and three support columns 40 vertically provided between the upper end plate 36 and the lower end plate 38 and connecting the upper end plate 36 and the lower end plate 38. Support recesses 41 are engraved at each of the three support columns 40 at equal intervals in a lengthwise direction of each of the three support columns 40. Support recesses 41 of the same stage of the three support columns 40 face one another.

By inserting the plurality of the substrates including the substrate 12 to the support recesses 41 of the three support columns 40, the boat 34S supports the plurality of the substrates vertically arranged in a multistage manner while the plurality of the substrates are horizontally oriented with their centers aligned with one another. A diameter of the substrate 12 is 200 mm or more.

Figure 3:
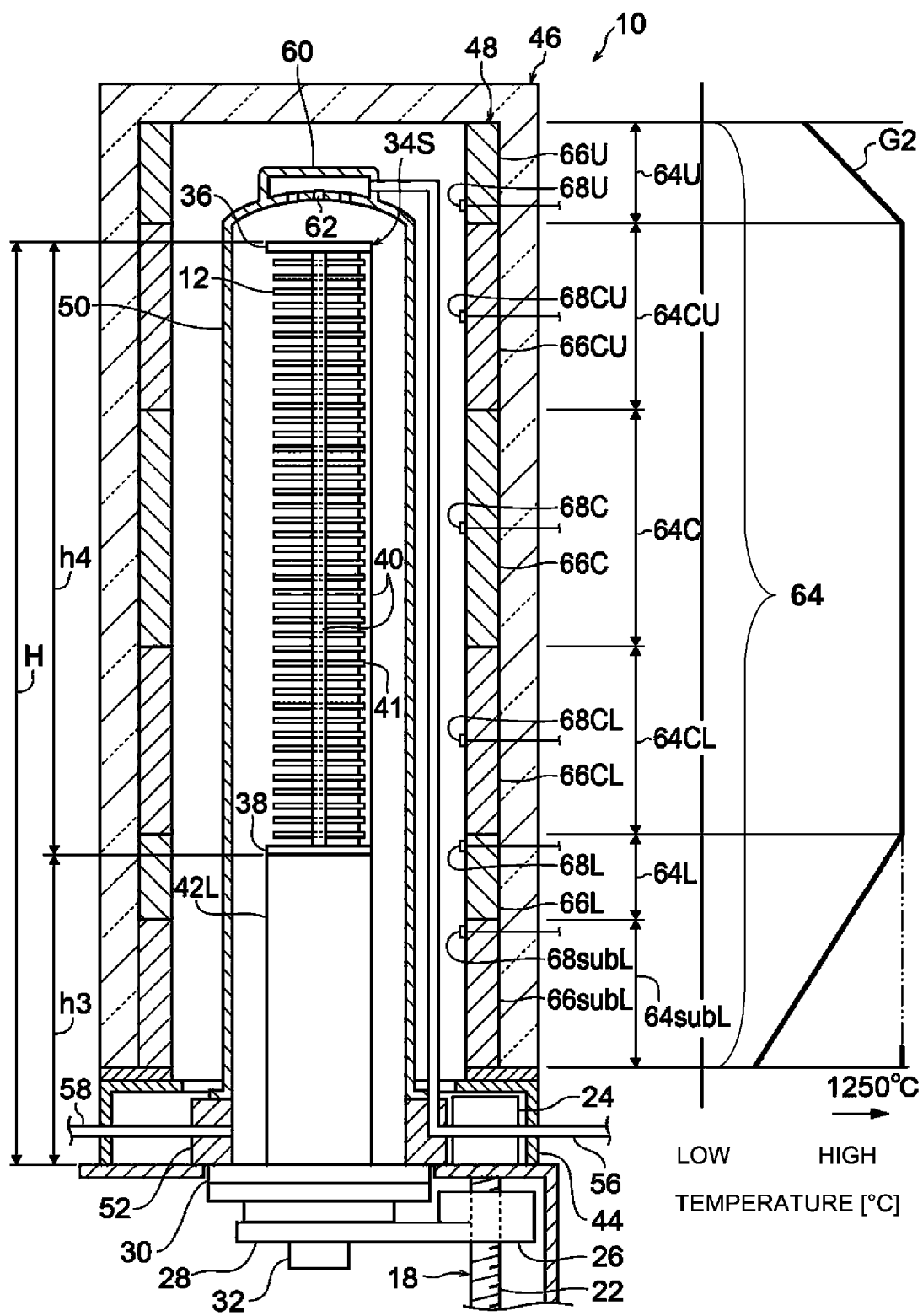
FIG. 3 is an enlarged view of a vertical cross-section of a part of the substrate processing apparatus when processing a substrate at 1,250° C.
Figure 5:
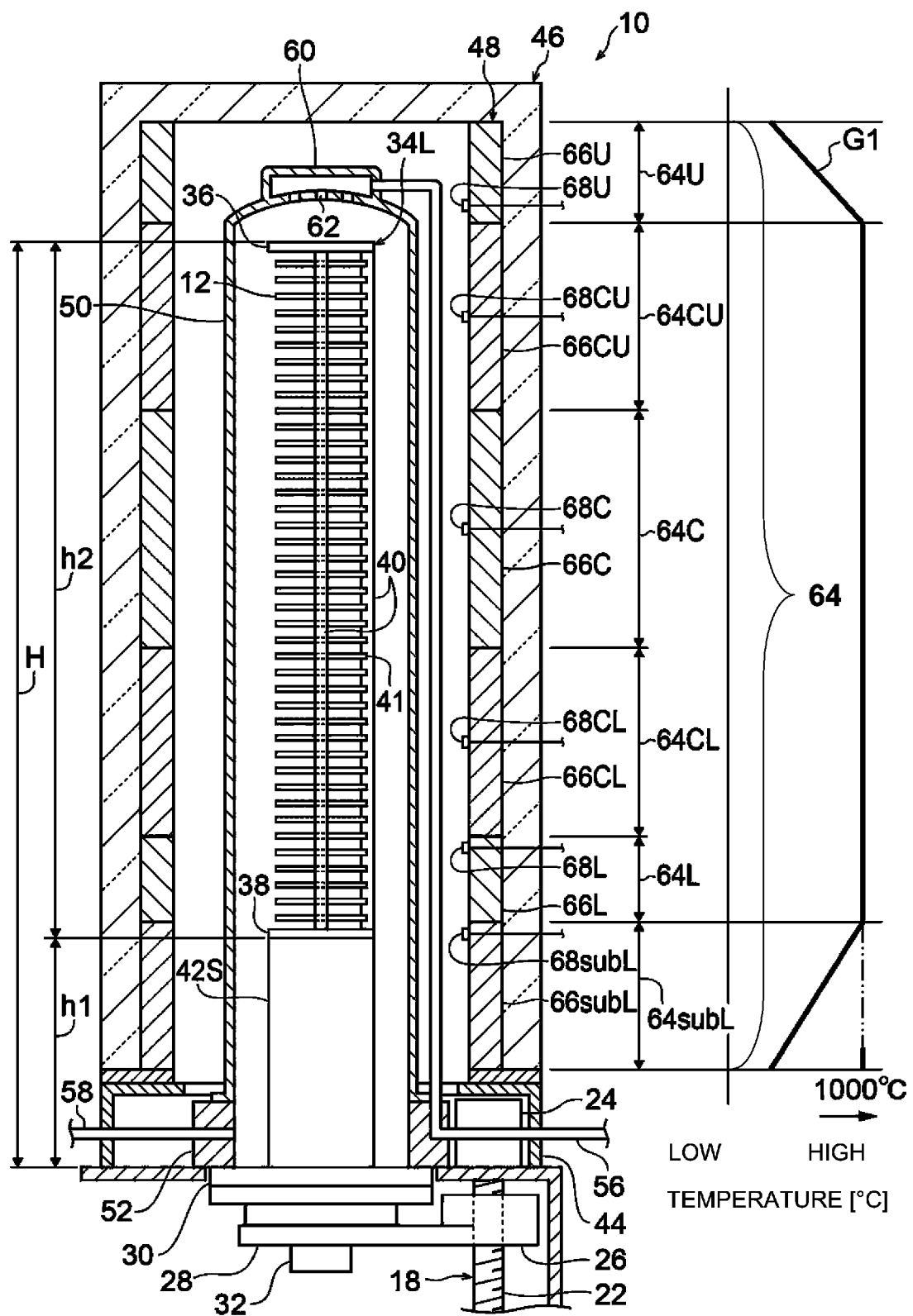
FIG. 5 is an enlarged view of the vertical cross-section of the part of the substrate processing apparatus when processing the substrate at 1,000° C.

As shown in FIGS. 3 and 5, both the heat insulating structure 42S and the heat insulating structure 42L are of a cylindrical shape, and a heat insulating material (not shown) is provided in each of the heat insulating structures 42S and 42L. The heat insulating structures 42S and 42L separate the boats 34L and 34S from the rotator 32. According to the present embodiment, for example, the boat 34S and a part of the heat insulating structure 42S are made of a material such as SiC (silicon carbide).

For example, a height of the boat 34S shown in FIG. 3 may be different from that of the boat 34L shown in FIG. 5, and accordingly, the number of substrates 12 to be loaded in the boat 34S may be different from the number of substrates 12 to be loaded in the boat 34L. According to the present embodiment, as shown in FIG. 3, the boat 34S is inserted into the reaction tube 50 in combination with the heat insulating structure 42L, and as shown in FIG. 5, the boat 34L is inserted into the reaction tube 50 in combination with the heat insulating structure 42S.

According to the present embodiment, shown in FIGS. 3 and 5, when a height of the heat insulating structure 42S is represented by "h1", the height of the boat 34L is represented by "h2", a height of the heat insulating structure 42L is represented by "h3" and the height of the boat 34S is represented by "h4", a relationship "h1+h2=h3+h4=H" is satisfied.

As shown in FIGS. 1 and 3, a scavenger 44 configured to trap substances such as particles from the heat insulating material and a process gas leaked from loading chamber 14 is provided above a ceiling plate of the loading chamber 14 so as to surround the boat loading/unloading port 20.

A heat insulating tank 46 of a cylindrical shape whose upper end is closed is vertically provided on the scavenger 44, and a heater cylinder 48 of a cylindrical shape is arranged inside the heat insulating tank 46 coaxially with the heat insulation tank 46.

In addition, on the ceiling plate of the housing 16, the reaction tube 50 of a cylindrical shape whose upper end is closed is arranged inside the heater cylinder 48 coaxially with the heater cylinder 48 via an adapter 52. The adapter 52 and the reaction tube 50 are coaxially arranged at the boat loading/unloading port 20 and supported by the housing 16.

A wafer transport device (which is a wafer transport mechanism) (not shown) configured to load (charge) the substrate 12 with respect to the boat 34S or 34L or to unload (discharge) the substrate 12 with respect to the boat 34S or 34L may be provided in the loading chamber 14.

For example, the reaction tube 50 is made of a material such as silicon carbide (SiC). The reaction tube 50 is of a cylindrical shape with the closed upper end and an open lower end. The adapter 52 made of quartz is arranged below the reaction tube 50, and the reaction tube 50 is supported on a ceiling wall (that is, the ceiling plate) of the housing 16 by the adapter 52. A process chamber (which is a process space) in which the substrate 12 is processed is formed in the reaction tube 50

For example, the adapter 52 of a cylindrical shape with open upper and lower ends. According to the present embodiment, a lower end opening of the adapter 52 serves as a furnace opening 54 through which the boat 34S or 34L and the heat insulating structure 42S or 42L are inserted. By contacting the lid 30 of the boat elevator 18 described above with a lower end surface of the adapter 52 so as to close the furnace opening 54, the insides of the reaction tube 50 and the adapter 52 are airtightly sealed. A furnace opening structure (also referred to as a "furnace opening assembly") includes at least the lid 30 and the rotator 32. The furnace opening structure may further include components such as the heat insulating structures 42S and 42L, the adapter 52 and the water cooling jacket 72.

A gas introduction pipe 56 and an exhaust pipe 58 are connected to the adapter 52. The gas introduction pipe 56 is connected to a buffer chamber 60 provided at a ceiling portion of the reaction tube 50 through the scavenger 44. One end of the gas introduction pipe 56 extends upward along a side surface of the reaction tube 50 outside the reaction tube 50 and is connected to the buffer chamber 60 so as to communicate with the buffer chamber 60. The other end of the gas introduction pipe 56 is connected to a gas supply source 59.

A plurality of gas ejection ports 62 are provided at the buffer chamber 60. A gas introduced (supplied) through the gas introduction pipe 56 diffuses in the buffer chamber 60, and then is showered (ejected) into the reaction tube 50 through the plurality of the gas ejection ports 62.

For example, instead of the configuration in which the gas introduction pipe 56 extends upward along the side surface of the reaction tube 50 outside the reaction tube 50, a configuration including: the gas introduction pipe 56 extending into the reaction tube 50 through the scavenger 44; an opening (not shown) provided at the gas introduction pipe 56 in the reaction tube 50; and a gas nozzle (not shown) of a tubular shape connected to the opening (not shown) and configured to guide the gas to an upper portion of the reaction tube 50 may be used.

An exhauster 76 such as a pump is connected to a downstream side of the exhaust pipe 58 to exhaust the gas in the reaction tube 50 or to control an inner pressure of the reaction tube 50. Therefore, the gas introduced into an upper portion of the process space in the reaction tube 50 through the plurality of the gas ejection ports 62 flows downward in the reaction tube 50, and is exhausted to an outside of the reaction tube 50 via the exhaust pipe 58.

<Configuration of Heater Cylinder>

As shown in FIG. 3, the heater cylinder 48 is arranged around the reaction tube 50. As described below, the heater cylinder 48 is divided into a plurality of zones 64 arranged along a tube axis direction (that is, along an axis of the heater cylinder 48). As described below, a temperature of each of the zones 64 can be individually controlled.

According to the present embodiment, for example, the plurality of the zones 64 includes a lowermost zone through an uppermost zone provided at the heater cylinder 48. The lowermost zone (that is, a zone closest to the furnace opening 54 of the heater cylinder 48) is referred to as a "subzone 64subL", a second zone from the bottom (that is, second closest to the furnace opening 54 of the heater cylinder 48) is referred to as a "buffer zone 64L", a third zone from the bottom is referred to as a "central lower zone 64CL", a fourth zone from the bottom is referred to as a "central zone 64C", a fifth zone from the bottom is referred to as a "central upper zone 64CU", and a sixth zone (that is, the uppermost zone) from the bottom is referred to as an "upper zone 64U".

A plurality of heaters 66 are provided corresponding to the plurality of zones 64, respectively. That is, a heater 66subL is arranged in the subzone 64subL, a heater 66L is arranged in the buffer zone 64L, a heater 66CL is arranged in the central lower zone 64CL, a heater 66C is arranged in the central zone 64C, a heater 66CU is arranged in the central upper zone 64CU and a heater 66U is arranged in the upper zone 64U. The heater 66L through the heater 66CU may constitute a soaking region where the temperature is homogenized. Thus, the plurality of the heaters 66 are carefully installed such that the heat is uniformly generated from each inner peripheral surface thereof. However, in practice, due to an arrangement of components such as a resistance wire, the heat may be generated non-uniformly (unevenly).

A plurality of temperature sensors 68 such as thermocouples are installed on inner peripheral walls of the plurality of the heaters 66 described above, respectively. That is, a temperature sensor 68subL is provided in the vicinity of an upper end of the heater 66subL of the subzone 64subL, a temperature sensor 68L is provided in the vicinity of an upper end of the heater 66L of the buffer zone 64L, a temperature sensor 68CL is provided in a center portion of the heater 66CL of the central lower zone 64CL in an axial direction, a temperature sensor 68C is provided in a center portion of the heater 66C of the central zone 64C in the axial direction, a temperature sensor 68CU is provided in a center portion of the heater 66CU of the central upper zone 64CU in the axial direction, and a temperature sensor 68U is provided in the vicinity of a lower end of the heater 66U of the upper zone 64U. In the present embodiment, the term "in the vicinity of the upper end" means, for example, within a few millimeters from the upper end, and the term "in the vicinity of the lower end" means, for example, within a few millimeters from the lower end.

Thus, the temperature sensor 68subL is configured to measure a heater temperature in the vicinity of the upper end of the heater 66subL of the subzone 64subL, the temperature sensor 68L is configured to measure the heater temperature in the vicinity of the upper end of the heater 66L of the buffer zone 64L, the temperature sensor 68CL is configured to measure the heater temperature of the center portion of the heater 66CL of the central lower zone 64CL wherein the "center" is defined in reference to the axial direction (likewise hereinafter), the temperature sensor 68C is configured to measure the heater temperature of the center portion of the heater 66C of the central zone 64C in the axial direction, the temperature sensor 68CU is configured to measure the heater temperature of the center portion of the heater 66CU of the central upper zone 64CU in the axial direction, and the temperature sensor 68U is configured to measure the heater temperature in the vicinity of the lower end of the heater 66U of the upper zone 64U.

Figure 4:
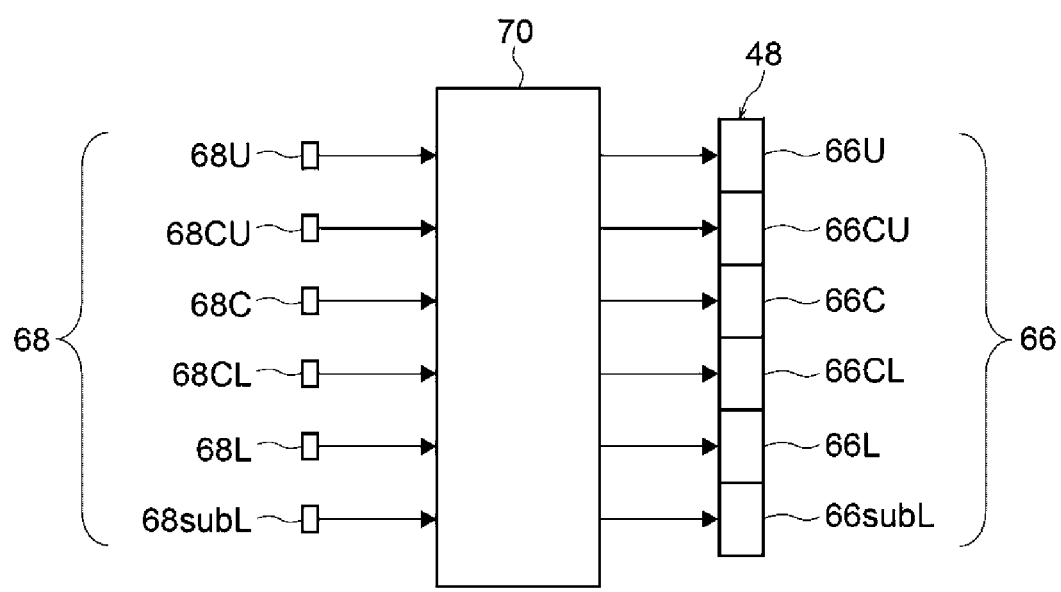
FIG. 4 is a block diagram schematically illustrating a temperature control system of the substrate processing apparatus according to the embodiments described herein.

As shown in FIG. 4, the plurality of the heaters 66 and the plurality of the temperature sensors 68 are connected to a temperature controller 70. A temperature of each of the heaters 66 is measured by each of the temperature sensors 68. The temperature controller 70 collects the temperature measurement data from each of the temperature sensors 68 such that that the temperature of each of the heaters 66 reaches its pre-set temperature. For example, the power supplied to each of the heaters 66 is controlled (feedback-controlled) such that temperatures of the zones 64subL to 64L reach their pre-set target temperatures, respectively.

In the substrate processing apparatus 10 according to the present embodiment, two types of boats of different heights (axial lengths), that is, the boat 34S and the boat 34L are prepared. As shown in FIG. 5, the boat 34L whose height is higher than that of the boat 34S is used when processing the substrate 12 at 1,000° C. As shown in FIG. 3, the boat 34S whose height is lower than that of the boat 34L is used when processing the substrate 12 at 1,250° C.

As shown in FIG. 3, a top (that is, the ceiling portion) of the reaction tube 50 is located at a position lower than an upper end of the heater cylinder 48, and is located in the upper zone 64U of the heater cylinder 48.

In addition, the height (axial length) h4 of the boat 34S, which is used in case of processing the substrate 12 at 1,250° C. and whose height is lower than that of the boat 34L, is set such that, when the boat 34S is arranged in the reaction tube 50, the following conditions are met: (i) an uppermost substrate among the plurality of the substrates loaded in the boat 34S is located in the vicinity of an upper end of the central upper zone 64CU (but lower than the upper end of the central upper zone 64CU); (ii) a lowermost substrate among the plurality of the substrates loaded in the boat 34S is located in the vicinity of a lower end of the central lower zone 64CL (but higher than the lower end of the central lower zone 64CL); and (iii) the plurality of the substrates loaded in the boat 34S are located in the central lower zone 64CL, the central zone 64C and the central upper zone 64CU.

In addition, the height h3 of the heat insulating structure 42L on which the boat 34S is placed is set (determined) such that: when the heat insulating structure 42L is inserted in the reaction tube 50, an upper end of the heat insulating structure 42L is located in the buffer zone 64L of the heater cylinder 48 (that is, the upper end of the heat insulating structure 42L is not located in the subzone 64subL or in the central lower zone 64CL).

As shown in FIG. 5, the height (axial length) h2 of the boat 34L, whose height is higher than that of the boat 34S, is set such that, when the boat 34L is arranged in the reaction tube 50, the following conditions are met: (i) an uppermost substrate among the plurality of the substrates loaded in the boat 34L is located in the vicinity of the upper end of the central upper zone 64CU (but lower than the upper end of the central upper zone 64CU); (ii) a lowermost substrate among the plurality of the substrates loaded in the boat 34L is located in the vicinity of a lower end of the buffer zone 64L (but higher than the lower end of the buffer zone 64L); and (iii) the plurality of the substrates loaded in the boat 34L are located in at least one among the buffer zone 64L, the central lower zone 64CL, the central zone 64C and the central upper zone 64CU.

In addition, the height h1 of the heat insulating structure 42S on which the boat 34L is placed is set (determined) such that: when the heat insulating structure 42S is inserted in the reaction tube 50, an upper end of the heat insulating structure 42S is not located higher than the upper end of the subzone 64subL of the heater cylinder 48 (that is, the upper end of the heat insulating structure 42S is not located in the buffer zone 64L).

Usually, a temperature variation (hunting) is likely to occur in a zone near a boundary between the soaking region and a temperature gradient region along the tube axis direction. Therefore, a height of the zone near the boundary is reduced to improve the controllability of the temperature variation. According to the present embodiment, the height of the buffer zone 64L is set equal to or less than half the height of the central lower zone 64CL and half the height of the subzone 64subL, which are adjacent to the buffer zone 64L.

<Heat Treatment Process: 1,000° C.>

A heat treatment process (for example, a process of forming an oxide film) using the substrate processing apparatus 10 according to the present embodiment will be described with reference to FIG. 6. For example, the substrate 12 is subject to the heat treatment process at a process temperature of 1,000° C. During a standby before the heat treatment process is started, an inner temperature of the heat insulating tank 46 is maintained at about 800° C. According to the present embodiment, for example, the target temperatures corresponding to the temperature sensors 68 are set to 800° C., and the temperature of each of the heaters 66 is controlled by the temperature controller 70.

The boat elevator 18 is driven, and the boat 34L (for the process of processing the substrate 12 at 1,000° C.) accommodating the plurality of substrates and supported by the heat insulating structure 42S prepared in advance is loaded (transferred) into the reaction tube 50 (boat loading), and the lid 30 closes the furnace opening 54 of the adapter 52 (inserting step S10).

Then, the temperature controller 70 performs a control operation to elevate the temperature of each zone at a constant temperature elevating rate so that a temperature of the soaking region reaches the process temperature, i.e., 1,000° C. (heating step S20). For example, a target temperature that changes continuously or intermittently at the constant temperature elevating rate is set. The target temperature that changes as described above may be stored in the temperature controller 70 as a temperature elevating/lowering pattern. Based on the temperature measurement data from the temperature sensor 68subL, the temperature measurement data from the temperature sensor 68L, the temperature measurement data from the temperature sensor 68CL, the temperature measurement data from the temperature sensor 68C, the temperature measurement data from the temperature sensor 68CU and the temperature measurement data from the temperature sensor 68U (temperature measuring step S30), the temperature controller 70 adjusts the power supplied to the heater 66subL, the heater 66L, the heater 66CL, the heater 66C, the heater 66CU and the heater 66U (temperature adjusting step S40) such that, finally, the temperature of the four zones (that is, the buffer zone 64L, the central lower zone 64CL, the central zone 64C and the central upper zone 64CU in which the plurality of the substrates including the substrate 12 are arranged) reach 1,000° C., the temperature in the vicinity of the upper end of the subzone 64subL is 1,000° C., and the temperature in the vicinity of a lower end of the upper zone 64U is 1,000° C.

Then, the process gas containing a compound such as the water vapor is introduced (supplied) into the reaction tube 50, and the substrate 12 is subject to the heat treatment process. When performing the heat treatment process of the substrate 12 (that is, when the substrate 12 is processed by the heat), the heat insulating structure 42S and the boat 34L are rotated by the rotator 32 (rotating step). As a result, even when the heat generated by the plurality of the heaters 66 is non-uniform (uneven) or the temperature is reduced in the vicinity of the gas introduction pipe 56, the heat supplied to the substrate 12 loaded in the boat 34L is averaged out. Therefore, the entirety of the substrate 12 is appropriately processed by the heat. In addition, the gas of a viscous flow flows on a surface of the substrate 12 in a circumferential direction due to the rotation and in a radial direction due to a centrifugal force, so that the process gas can be uniformly contact with the entirety of the substrate 12, and the entirety of the substrate 12 can be appropriately processed by the heat. That is, the rotator 32 is configured to rotate the boat 34L such that, when the substrate 12 is subject to the heat treatment process, the boat 34L is rotated at a speed capable of improving an uniformity of the heat treatment process in a radial direction of the boat 34L.

According to the present embodiment, the heater 66CL is provided adjacent to an upper portion of the heater 66subL, but no heater is provided below a lower portion of the heater 66subL. Therefore, comparing temperatures of the upper and lower portions of the heater 66subL, the temperature of the lower portion of the heater 66subL is lower than the temperature of the upper portion of the heater 66subL (because the heat from the heater 66subL escapes toward the scavenger 44 provided below the heater 66subL). Thus, as shown by the graph line G1 in FIG. 5 indicating the heater temperature, the temperature of the heater 66subL decreases as it goes downward. That is, in the heater 66subL, a temperature gradient is formed such that the upper portion of the heater 66subL is at a high temperature and the lower portion of the heater 66subL is at a low temperature. As a result, the soaking region is obtained between the buffer zone 64L and the central upper zone 64CU.

Below the heater 66subL, a temperature distribution in a process tube (that is, the reaction tube 50) continues to drop at a predetermined gradient due to a heat insulating action of the heat insulating structure 42S, and reaches a sufficiently low temperature (for example, 200° C. or less) at the rotator 32. As a result, even when a magnetic fluid seal is used as the fluid seal 32C of the rotator 32, it is possible to effectively suppress the deterioration of a sealing property of the fluid seal 32C and the deterioration of a durability of the rotator 32 due to the temperature elevating.

In addition, in the substrate processing apparatus 10 according to the present embodiment, the cooling water supplied from the cold water supply apparatus 74 can be circulated inside the water cooling jacket 72 as desired. Thereby, it is possible to further lower the temperature of the rotator 32.

In addition, according to the present embodiment, the heater 66CU is provided adjacent to a lower portion of the heater 66U, but no heater is provided above an upper portion of the heater 66U. Therefore, comparing temperatures of the upper and lower portions of the heater 66U, the temperature of the upper portion of the heater 66U is lower than the temperature of the lower portion of the heater 66U. Thus, as shown by the graph line G1 in FIG. 5 indicating the heater temperature, the temperature of the heater 66U decreases as it goes upward.

When the heat treatment process of the substrate 12 is completed, the inner temperature of the heat insulating tank 46 is cooled to a standby temperature, the lid 30 is lowered by the boat elevator 18, and the plurality of the substrates including the substrate 12 to which the heat treatment process is performed are unloaded out of the reaction tube 50 while being supported by the boat 34L (boat unloading step). Then, the plurality of the substrates of which the heat treatment process is completed are discharged (transported) out of the boat 34L (wafer discharging step).

<Heat Treatment Process at High Temperature: 1,250° C.>

Hereinafter, a heat treatment process (for example, an annealing process using a rare gas such as argon gas or hydrogen gas) using the substrate processing apparatus 10 according to the present embodiment at a high temperature higher than 1,000° C. will be described. For example, the substrate 12 is subject to the heat treatment process at a process temperature of 1,250° C. Even when the substrate 12 is subject to the heat treatment process at the high temperature of 1,250° C., the process flow thereof is almost the same as the heat treatment process at 1,000° C. described above. The temperature controller 70 performs a control operation to elevate the temperature of each zone at a constant temperature elevating rate. When the temperature controller 70 performs the control operation, the temperature elevating rate of the heater 66subL whose target temperature is 1,000° C. is set smaller than the temperature elevating rate of the other heaters (that is, the heater 66L, the heater 66CL, the heater 66C, the heater 66CU and the heater 66U), and each of the heaters 66 is controlled so as to reach its target temperature almost simultaneously. Based on the temperature measurement data from the temperature sensor 68subL, the temperature measurement data from the temperature sensor 68L, the temperature measurement data from the temperature sensor 68CL, the temperature measurement data from the temperature sensor 68C, the temperature measurement data from the temperature sensor 68CU and the temperature measurement data from the temperature sensor 68U, the temperature controller 70 adjusts the power supplied to the heater 66subL, the heater 66L, the heater 66CL, the heater 66C, the heater 66CU and the heater 66U. Thereby, finally, the temperature of the three zones (that is, the central lower zone 64CL, the central zone 64C and the central upper zone 64CU in which the plurality of the substrates including the substrate 12 are arranged) reaches 1,250° C., the temperature in the vicinity of an upper end of the buffer zone 64L reaches 1,250° C., the temperature in the vicinity of the upper end of the subzone 64subL reaches 1,000° C., and the temperature in the vicinity of the lower end of the upper zone 64U reaches 1,250° C.

According to the present embodiment, the heater 66CL whose temperature at its upper end is set to 1,250° C. is provided above an upper portion of the heater 66L of the buffer zone 64L and the heater 66subL whose temperature at its upper end is set to 1,000° C. is provided below a lower portion of the heater 66L of the buffer zone 64L. Therefore, comparing temperatures of the upper and lower portions of the heater 66L of the buffer zone 64L, the temperature of the lower portion of the heater 66L is lower than the temperature of the upper portion of the heater 66L. Thus, as shown by the graph line G2 in FIG. 3 indicating the heater temperature, the temperature of the heater 66L decreases as it goes downward. That is, in the heater 66L, a temperature gradient is formed such that the upper portion of the heater 66L is a high temperature and the lower portion of the heater 66L is a low temperature.

In addition, in the subzone 64subL, a temperature gradient is formed similar to that of the heat treatment process at 1,000° C. described above. The graph line G2 in FIG. 3 illustrates an ideal temperature gradient in which the temperature decreases at a constant rate over the heater 66L and the heater 66subL. However, the gradients in the heater 66L and the heater 66subL may be different. A descending gradient might start from a middle of the heater 66subL, and moreover, an ascending gradient might appear between the upper end and the middle of the heater 66subL as a hunting. In the heater 66subL, a lower temperature at the lower end than that at the upper end is only needed. On that occasion, an averaged gradient within the heater 66subL is negative (i.e. decreasing toward the furnace opening) and may be closer to zero than an averaged gradient within the heater 66L. In practice, it may be preferred that the change in the temperature gradient at a boundary between the heater 66L and the heater 66subL is sufficiently small. Thereby, it is possible to easily suppress the temperature fluctuation in the soaking region. An intermediate temperature may be adjusted by actually measuring the temperature fluctuation and reducing the temperature fluctuation. That is, the intermediate temperature, which is a target temperature of the temperature sensor 68subL, may be set to a temperature other than 1,000° C. within a range that does not exceed an upper limit of the heater temperature.

Then, the process gas containing the argon gas or the hydrogen gas is introduced (supplied) into the reaction tube 50, and the substrate 12 is subject to the heat treatment process at the high temperature. At a temperature such as 1,250° C., the oxygen-mediated sublimation or the coagulation actively occurs. That is, silicon (Si) of the substrate 12 is oxidized to become silicon oxide (SiO), and then it evaporates or is deposited as Si or $SiO_2$ on the substrate 12. Since the reactions described above occur near an equilibrium condition, a slight difference in the temperature or in the pressure may cause the non-uniformity in the heat treatment process at the high temperature and may generate particles. According to the present embodiment, since the boat 34S is rotated during the heat treatment process at the high temperature, the temperature of the substrate 12 is uniformized. In addition, since the process gas containing the argon gas or the hydrogen gas flows on the surface of the substrate 12 in the radial direction due to the centrifugal force, a partial pressure of the $SiO_2$ can be reduced from a center of the substrate 12 to the vicinity of an outer periphery of the substrate 12. Therefore, it is possible to reduce the unwanted deposition of Si or $SiO_2$ on the substrate 12. That is, the rotator 32 is configured to rotate the boat 34S such that, when the substrate 12 is subject to the heat treatment process at the high temperature, the boat 34S is rotated at a speed capable of improving the uniformity of the heat treatment process at the high temperature in the radial direction of the boat 34S. In addition, an etching rate of the sublimation as described above is maximized at a temperature (transition temperature) near a boundary between a passive oxidation at a low temperature and a high oxygen partial pressure and an active oxidation at a high temperature and a low oxygen partial pressure, and a large amount of the SiO is generated. Therefore, the boat 34S may be rotated not only during the heat treatment process the 1,250° C. but also when the temperature of, e.g., each zone passes through the transition temperature while the temperature is elevated or lowered. As a result, it is possible to suppress the adhesion (haze) to the substrate 12 due to the sublimation or the coagulation.

For example, the heat treatment process at the high temperature includes, for example, an argon annealing process of reducing crystal defects such as COP (Crystal Originated Particles) in the substrate 12 such as a silicon substrate, an activation annealing process of activating the dopant in the substrate 12 such as a silicon carbide (SiC) substrate and a high temperature and high pressure annealing process of removing pores or improving a filling state of a via or a trench. The argon annealing process appears becomes effective at 600° C. or higher, and its effect increases as the temperature is elevated. When the temperature is lower than 1,250° C., it is difficult to obtain the high crystal quality and the flatness (uniformity) currently demanded even when the boat 34S is rotated. However, when the temperature is 1,250° C. or higher, it is possible to satisfy the current demands of, for example, the high crystal quality and the flatness. An upper limit temperature at which the heat treatment process at the high temperature can be performed is limited by a melting point (1,414° C.) of the substrate 12 such as the silicon substrate, or by a heat resistant temperature of the heaters 66 or the heat insulating tank 46. Since the activation annealing process for the SiC is typically performed at 1,400° C. to 1,800° C., it is sufficient that a practical upper limit temperature is 2,000° C. When the heat treatment process at the high temperature is performed at a temperature higher than the upper limit temperature, the substrate 12 or the substrate processing apparatus 10 itself may be damaged, but when the heat treatment process at the high temperature is performed at a temperature equal to or lower than the upper limit temperature, it is possible to process the substrate 12 normally.

As described above, in the substrate processing apparatus 10 according to the present embodiment, by individually controlling the temperature of each heater of the heater cylinder 48, it is possible to process the substrate 12 at 1,000° C. by the heat treatment process or to process the substrate 12 at 1,250° C. by the heat treatment process at the high temperature while suppressing the deterioration of the durability of the rotator 32. When the substrate 12 processed at 1,250° C. by the heat treatment process at the high temperature, it is possible to suppress the heat damage to the rotator 32. This is because, likewise as the above-described case of the heat treatment process at 1,000° C., the temperature gradients are formed such that the temperature is lower in the lower portion of the heater 66L and the temperature gradient in which the temperature is lower in the lower portion of the heater 66subL than in the upper portion of the heater 66subL.

According to the present embodiment, the same zone arrangement in the heaters 66 can be applied to both of the heat treatment process at 1,000° C. and the heat treatment process at 1,250° C. Further, it is possible to allow a distance between a rotator 32 or the heat insulating tank 46 and the furnace opening 54 (that is, a height of the scavenger 44) to remain the same between the two heat treatment processes. Therefore, it is possible to allow a height of the housing to remain the same and to commonly use most of the configuration of the substrate processing apparatus 10 in the two heat treatment processes.

Other Embodiments

While the technique is described in detail by way of the above-described embodiment, the above-described technique is not limited thereto. The above-described technique may be modified in various ways without departing from the gist thereof.

For example, the above-described embodiment is described by way of an example in which the substrate (wafer) is processed. However, the above-described technique is not limited thereto. For example, the above-described technique may also be applied to substrate processing apparatuses configured to process a glass substrate of a liquid crystal panel or a substrate such as a magnetic disk and an optical disk.

For example, the above-described embodiment is described by way of an example in which the water cooling jacket 72 and the cold water supply apparatus 74 are used to cool the rotator 32 with the cooling water. However, the above-described technique is not limited thereto. For example, the water cooling jacket 72 and the cold water supply apparatus 74 may be omitted. That is, the above-described technique may also be applied when the water cooling jacket 72 and the cold water supply apparatus 74 is not provided. In addition, a radiation fin may be provided at the rotator 32. By blowing (supplying) the air toward the radiation fin by a blower, it is possible to cool the rotator 32.

For example, the above-described embodiment is described by way of an example in which the single substrate processing apparatus 10 is configured to perform both the heat treatment process at 1,000° C. and the heat treatment process at 1,250° C. However, the above-described technique is not limited thereto. For example, two substrate processing apparatuses may be provided. One of the two substrate processing apparatuses may be used to perform the heat treatment process at 1,000° C. and the other of the two may be used to perform the heat treatment process at 1,250° C. In addition, components of the substrate processing apparatus 10 other than the boat and the heat insulating structure do not have to be shared between the heat treatment process at 1,000° C. and the heat treatment process at 1,250° C., and may be different depending on a process temperature. For example, the adapter 52 may be omitted. In particular, the adapter 52 may be formed of the same material as the reaction tube 50 as an integrated part of the reaction tube 50 when the heat treatment process at 1,000° C. is performed. In addition, a profile thermocouple may be further provided in the reaction tube 50 to control the heater temperature in a cascade manner.

According to some embodiments in the present disclosure, it is possible to reduce the thermal damage to the furnace opening structure when processing the substrate at a high temperature.

What is claimed is:

1. A substrate processing apparatus comprising:
a reaction tube provided with a furnace opening at one end thereof through which a first boat accommodating a plurality of substrates is to be inserted, wherein a process chamber in which the plurality of the substrates are processed is provided in the reaction tube;
a plurality of heaters provided on an outer periphery of the reaction tube and respectively in a plurality of zones arranged along a tube axis direction from a furnace opening side to another end of the reaction tube, wherein each of the plurality of the zones corresponds to a single heater among the plurality of the heaters and comprises a unit to be individually controlled;
a plurality of temperature sensors configured to measure temperatures of the zones or temperatures of the heaters respectively corresponding to the plurality of the zones;
a temperature controller configured to control electric power supplied to each of the heaters based on temperature data obtained by the plurality of the temperature sensors to adjust each of the temperatures of the zones; and
a furnace opening assembly comprising a lid configured to close the furnace opening; and a rotator provided at the lid and configured to rotate the first boat,
wherein the plurality of zones comprise upper zones and lower zones located closer to the furnace opening than the upper zones are located, the upper zones being located over a height range equivalent to that of the substrates accommodated in the first boat whereas the lower zones are located within a height range excluding that of the substrates accommodated in the first boat, and the plurality of the heaters comprising upper heaters of the upper zones and lower heaters of the lower zones,
wherein the temperature controller is further configured to, when the plurality of the substrates are subject to a heat treatment process by the plurality of the heaters, control the electric power supplied to the plurality of the heaters such that temperatures of the upper heaters reach a first temperature of around 1,250° C. or higher, and that a temperature gradient is formed in the lower zones such that a temperature decreases toward the furnace opening, and
wherein the lower zones comprise a first zone and a second zone located closer to the furnace opening than the first zone is located such that a bottom of the second zone has a same height as a bottom of the plurality of heaters, the first zone and the second zone of the lower zones respectively have a first length and a second length along the tube axis direction, and the first length is shorter than or equal to half of the second length.

2. The substrate processing apparatus of claim 1, wherein the plurality of temperature sensors comprise lower temperature sensors provided corresponding to the lower zones and upper temperature sensors provided corresponding to the upper zones, the lower temperature sensors are arranged in vicinity of upper ends of the lower heaters, respectively, and
a temperature sensor among the plurality of the temperature sensors that is second closest to the furnace opening is arranged in vicinity of an upper end of a heater among the plurality of the heaters that is second closest to the furnace opening.

3. The substrate processing apparatus of claim 2, further comprising a first heat insulating structure provided between the lid and the first boat,
wherein a height of the first heat insulating structure is set such that, when the furnace opening is closed by the lid, an upper end of the heat insulating structure is located at a height corresponding to a zone among the plurality of the zones that is second closest to the furnace opening.

4. The substrate processing apparatus of claim 3, further comprising a gas introduction pipe configured to supply a rare gas into the process chamber while the plurality of the substrates are subject to the heat treatment process.

5. The substrate processing apparatus of claim 3, wherein the rotator is configured to rotate the plurality of the substrates when the plurality of the heaters are controlled at a process temperature of 1,250° C. or higher.

6. The substrate processing apparatus of claim 3, wherein the rotator is configured to stop the rotation of the plurality of the substrates when the plurality of the heaters are controlled at a process temperature of 1,250° C. or higher, and to rotate the plurality of the substrates when the plurality of the heaters are controlled at a temperature range lower than the process temperature and comprising a transition temperature between a passive oxidation and an active oxidation.

7. The substrate processing apparatus of claim 3, further comprising an elevator configured to load the first boat into the reaction tube and to unload the first boat out of the reaction tube,
wherein the rotator is configured to suspend the rotation of the plurality of the substrates when the plurality of the heaters are controlled at a process temperature of 1,250° C. or higher, and to rotate the plurality of the substrates when the first boat is loaded into the reaction tube or unloaded out of the reaction tube by the elevator and temperatures of the substrates are lower than the process temperature.

8. The substrate processing apparatus of claim 2, wherein the rotator is configured to rotate the plurality of the substrates when the plurality of the heaters are controlled at a process temperature of 1,250° C. or higher.

9. The substrate processing apparatus of claim 2, wherein the rotator is configured to stop the rotation of the plurality of the substrates when the plurality of the heaters are controlled at a process temperature of 1,250° C. or higher, and to rotate the plurality of the substrates when the plurality of the heaters are controlled at a temperature range lower than the process temperature and comprising a transition temperature between a passive oxidation and an active oxidation.

10. The substrate processing apparatus of claim 2, further comprising an elevator configured to load the first boat into the reaction tube and to unload the first boat out of the reaction tube,
wherein the rotator is configured to suspend the rotation of the plurality of the substrates when the plurality of the heaters are controlled at a process temperature of 1,250° C. or higher, and to rotate the plurality of the substrates when the first boat is loaded into the reaction tube or unloaded out of the reaction tube by the elevator and temperatures of the substrates are lower than the process temperature.

11. The substrate processing apparatus of claim 1, wherein when the plurality of the substrates are subject to the heat treatment process, the first boat is rotated at a speed that allows a gas to flow on a surface of each of the substrates in a circumferential direction and in a radial direction of the first boat,
wherein the temperature controller is further configured to control the electric power supplied to each of the upper heaters such that the temperatures thereof are equal to the first temperature, temperatures of the lower heaters are lower than the first temperature, and a temperature gradient is formed in a zone among the plurality of the zones that is second closest to the furnace opening.

12. The substrate processing apparatus of claim 11, further comprising a gas introduction pipe configured to supply a rare gas into the process chamber while the plurality of the substrates are subject to the heat treatment process.

13. The substrate processing apparatus of claim 11, wherein the rotator is configured to rotate the plurality of the substrates when the plurality of the heaters are controlled at a process temperature of 1,250° C. or higher.

14. The substrate processing apparatus of claim 11, wherein the rotator is configured to stop the rotation of the plurality of the substrates when the plurality of the heaters are controlled at a process temperature of 1,250° C. or higher, and to rotate the plurality of the substrates when the plurality of the heaters are controlled at a temperature range lower than the process temperature and comprising a transition temperature between a passive oxidation and an active oxidation.

15. The substrate processing apparatus of claim 11, further comprising an elevator configured to load the first boat into the reaction tube and to unload the first boat out of the reaction tube,
wherein the rotator is configured to suspend the rotation of the plurality of the substrates when the plurality of the heaters are controlled at a process temperature of 1,250° C. or higher, and to rotate the plurality of the substrates when the first boat is loaded into the reaction tube or unloaded out of the reaction tube by the elevator and temperatures of the substrates are lower than the process temperature.

16. The substrate processing apparatus of claim 1, further comprising a gas introduction pipe configured to supply a rare gas into the process chamber while the plurality of the substrates are subject to the heat treatment process.

17. A method of manufacturing a semiconductor device using the apparatus of claim 1 comprising:
(a) inserting a first boat accommodating a plurality of substrates into a reaction tube through a furnace opening provided at one end of the reaction tube;
(b) heating the plurality of the substrates by a plurality of heaters provided on an outer periphery of the reaction tube and respectively in a plurality of zones arranged along a tube axis direction from the furnace opening to another end of the reaction tube;
(c) measuring temperatures of the zones or temperatures of the heaters respectively corresponding to the plurality of the zones, wherein the plurality of the zones comprise upper zones and lower zones located closer to the furnace opening than the upper zones are located, the upper zones being located over a height range equivalent to that of the substrates accommodated in the first boat whereas the lower zones being located within a height range excluding that of the substrates accommodated in the first boat, and the plurality of the heaters comprising upper heaters of the upper zones and lower heaters of the lower zones; and
(d) controlling electric power supplied to the plurality of the heaters based on temperature data obtained by a plurality of temperature sensors such that temperatures of the upper heaters reach a first temperature of around 1,250° C. or higher, temperatures of the lower zones are lower than temperatures of the upper zones, and forming a temperature gradient in the lower zones such that a temperature decreases toward the furnace opening.

* * * * *